United States Patent
Lu et al.

(10) Patent No.: US 10,154,604 B2
(45) Date of Patent: Dec. 11, 2018

(54) CHASSIS DRAWER FOR MODULAR INFORMATION HANDLING RESOURCES

(71) Applicant: Dell Products L.P., Round Rock, TX (US)

(72) Inventors: Yi-Wei Lu, Taipei (TW); Chun Yang Tseng, Taipei (TW)

(73) Assignee: Dell Products L.P., Round Rock, TX (US)

( * ) Notice: Subject to any disclaimer, the term of this patent is extended or adjusted under 35 U.S.C. 154(b) by 90 days.

(21) Appl. No.: 14/693,192

(22) Filed: Apr. 22, 2015

(65) Prior Publication Data

US 2016/0316585 A1   Oct. 27, 2016

(51) Int. Cl.
 *A47B 95/02* (2006.01)
 *H05K 7/14* (2006.01)

(52) U.S. Cl.
 CPC ......... *H05K 7/1489* (2013.01); *H05K 7/1487* (2013.01)

(58) Field of Classification Search
 CPC .. H05K 5/0221; H05K 5/0217; H05K 5/0239; H05K 5/026; H05K 5/0286; H05K 5/023; H05K 7/1489; H05K 7/023; H05K 7/1487
 USPC ...................................................... 312/332.1
 See application file for complete search history.

(56) References Cited

U.S. PATENT DOCUMENTS

| | | | | |
|---|---|---|---|---|
| 1,897,080 A * | 2/1933 | Soper | ...................... | E05B 65/46 220/326 |
| 2,689,777 A * | 9/1954 | Wolters | ................... | E05B 65/46 292/175 |
| 3,450,453 A * | 6/1969 | Tazaki | .................... | E05B 65/46 312/217 |
| 3,549,228 A * | 12/1970 | Aleks | ...................... | A47B 95/02 312/330.1 |
| 3,574,436 A * | 4/1971 | Anderson | ............... | E05B 65/46 312/332.1 |
| 4,589,162 A * | 5/1986 | Manz | ..................... | H05K 5/023 16/429 |
| 6,134,116 A * | 10/2000 | Hoss | ......................... | E05C 1/10 292/146 |
| 6,374,460 B1 * | 4/2002 | Edevold | ................. | A45C 13/26 16/422 |

(Continued)

*Primary Examiner* — Daniel J Troy
*Assistant Examiner* — Timothy M Ayres
(74) *Attorney, Agent, or Firm* — Jackson Walker L.L.P.

(57) ABSTRACT

A mechanical assembly in a drawer may include a handle rotationally coupled to a cover and configured to rotate between a closed position and an open position relative to the cover. The mechanical assembly may also include a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis. The mechanical assembly may further include a cam mechanically coupled to the handle and responsive to rotational motion of the handle such that in the closed position of the handle, the spring latch is in its biased position, and as the handle is rotated between the closed position and the open position, the cam causes the spring latch to deflect from its biased position in a direction perpendicular to the direction of translation.

21 Claims, 9 Drawing Sheets

(56) References Cited

U.S. PATENT DOCUMENTS

| | | | | |
|---|---|---|---|---|
| 6,820,953 B2* | 11/2004 | Wojcik | ............... | G11B 33/123 |
| | | | | 312/332.1 |
| 6,851,286 B2* | 2/2005 | Dube | ............... | E05B 65/46 |
| | | | | 292/336.3 |
| 7,423,869 B2* | 9/2008 | Su | ............... | G06F 1/187 |
| | | | | 312/223.2 |
| 7,864,522 B1* | 1/2011 | Peng | ............... | G06F 1/187 |
| | | | | 312/223.2 |
| 8,944,538 B2* | 2/2015 | Li | ............... | H05K 7/20172 |
| | | | | 312/223.2 |
| 8,976,536 B2* | 3/2015 | French, Jr. | ............... | H05K 7/1427 |
| | | | | 16/221 |
| 9,210,821 B2* | 12/2015 | Lin | ............... | H05K 5/0221 |
| 2009/0080165 A1* | 3/2009 | Barina | ............... | H05K 7/1411 |
| | | | | 361/747 |
| 2011/0169389 A1* | 7/2011 | Jeffries | ............... | A47B 95/02 |
| | | | | 312/333 |
| 2012/0293975 A1* | 11/2012 | Liang | ............... | G06F 1/188 |
| | | | | 361/807 |
| 2013/0127311 A1* | 5/2013 | Chiu | ............... | G06F 1/20 |
| | | | | 312/236 |
| 2014/0126144 A1* | 5/2014 | Kyle | ............... | G06F 1/16 |
| | | | | 361/679.58 |
| 2014/0184040 A1* | 7/2014 | Li | ............... | H05K 5/023 |
| | | | | 312/223.1 |

* cited by examiner

CHASSIS DRAWER FOR MODULAR INFORMATION HANDLING RESOURCES

TECHNICAL FIELD

The present disclosure relates to modular information handling systems. More specifically, embodiments of the disclosure provide systems and methods for a chassis drawer for carrying and providing access to modular information handling resources for addition and/or removal of such modular information handling resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays are typically accessed from a side of the chassis in which the information handling resources may be added or removed. However, because access may be limited to the periphery of the chassis, such an architecture may limit the density of modular components that may be disposed in a chassis.

Accordingly, a chassis may include a drawer for carrying information handling resources wherein the information handling resources may be accessed from the sides of the drawer. However, one component of such a drawer that may limit component density is a latching mechanism to maintain the drawer in a closed position with respect to the chassis particularly where such latching mechanism has a large dimension perpendicular to the direction of movement of the drawer.

SUMMARY

In accordance with the teachings of the present disclosure, the disadvantages and problems associated with traditional approaches to providing a latch to a drawer for accessing modular information handling resources in a chassis have been substantially reduced or eliminated.

In embodiments of the present disclosure, a drawer for receiving components may include a carrier member comprising a plurality of bays, each bay having one or more structural components for receiving a modular information handling resource, a cover coupled to the carrier member, and a mechanical assembly coupled to the cover. The mechanical assembly may include a handle rotationally coupled to the cover and configured to rotate between a closed position and an open position relative to the cover. The mechanical assembly may also include a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis. The mechanical assembly may further include a cam mechanically coupled to the handle and responsive to rotational motion of the handle such that in the closed position of the handle, the spring latch is in its biased position, and as the handle is rotated between the closed position and the open position, the cam causes the spring latch to deflect from its biased position in a direction perpendicular to the direction of translation.

In accordance with these and other embodiments of the present disclosure, an information handling system may include a chassis and a drawer for receiving components. The drawer may include a carrier member comprising a plurality of bays, each bay having one or more structural components for receiving a modular information handling resource, a cover coupled to the carrier member, and a mechanical assembly coupled to the cover. The mechanical assembly may include a handle rotationally coupled to the cover and configured to rotate between a closed position and an open position relative to the cover. The mechanical assembly may also include a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis. The mechanical assembly may further include a cam mechanically coupled to the handle and responsive to rotational motion of the handle such that in the closed position of the handle, the spring latch is in its biased position, and as the handle is rotated between the closed position and the open position, the cam causes the spring latch to deflect from its biased position in a direction perpendicular to the direction of translation.

In accordance with these and other embodiments of the present disclosure, a method may include mechanically coupling a cover to a carrier member comprising a plurality of bays, each bay having one or more structural components for receiving a modular information handling resource. The method may also include mechanically coupling a mechanical assembly to the cover, the mechanical assembly comprising: a handle rotationally coupled to the cover and configured to rotate between a closed position and an open position relative to the cover; a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis; and a cam mechanically coupled to the handle and responsive to rotational motion of the handle such that, in the closed position of the handle, the spring latch is in its biased position, and as the handle is rotated between the closed position and the open position, the cam causes the spring latch to deflect from its biased position in a direction perpendicular to the direction of translation.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-10, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
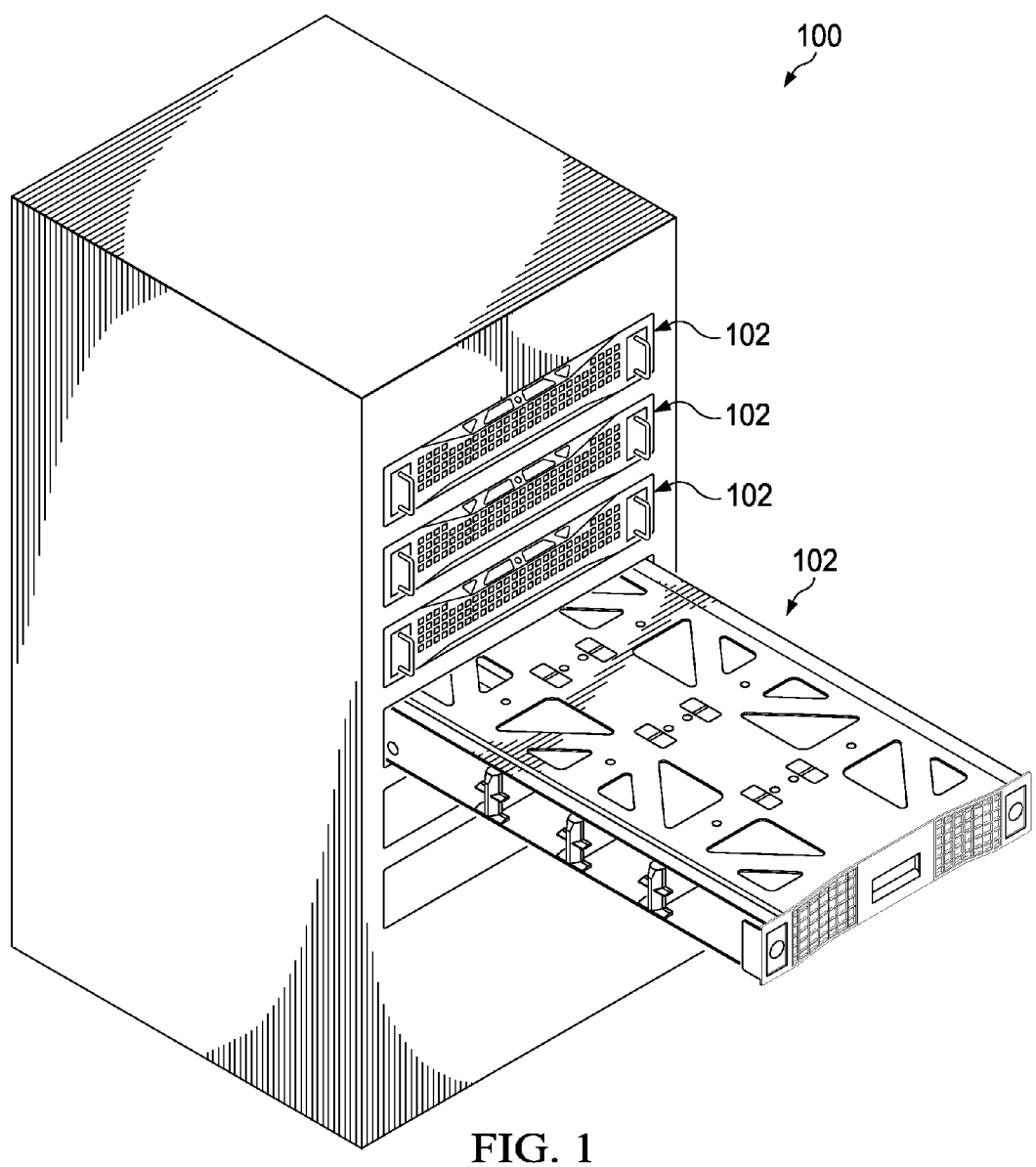
FIG. 1 illustrates a perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more drawers 102 for receiving information handling resources, as described in greater detail below.

Figure 2:
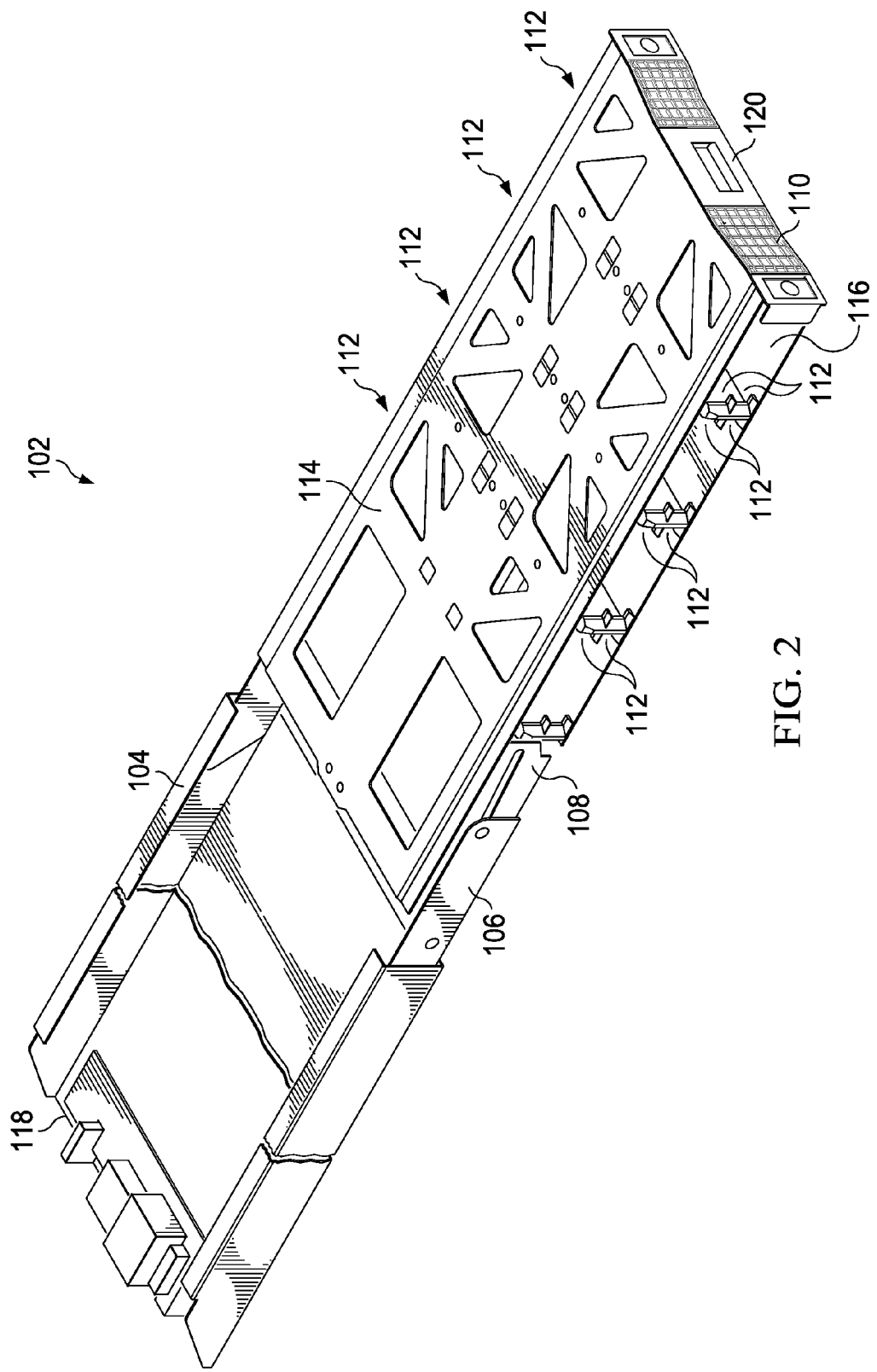
FIG. 2 illustrates a perspective view of an example chassis drawer for receiving modular information handling resources, the drawer in an open position, in accordance with embodiments of the present disclosure.

FIG. 2 illustrates a perspective view of an example chassis drawer 102 for receiving modular information handling resources, wherein drawer 102 is in an open position drawn from chassis 100, in accordance with embodiments of the present disclosure. As shown in FIG. 2, chassis drawer 102 may comprise an intermediate member 106 mechanically coupled to a sleeve 104 of chassis 100, and a carrier member 108 mechanically coupled to intermediate member 106. Sleeve 104 may be constructed from steel, aluminum, plastic, and/or any other suitable material. Although sleeve 104 may have any suitable size and/or shape, sleeve 104 is depicted in the embodiments represented by FIG. 2 as having two substantially planar and parallel opposite sides defining a drawer height coupled to each other by a substantially planar bottom generally perpendicular to the sides defining a drawer width and a guide flange extending from and running perpendicular to and along the length of each side such that the flanges project towards each other. In some embodiments, rather than including guide flanges, sleeve 104 may include a substantially planar top opposite from and generally parallel to its bottom. In some embodiments, sleeve 104 may be mechanically coupled to the internal mechanical structure of chassis 100, such that sleeve 104 is fixed relative to chassis 100.

Intermediate member 106 may be constructed from steel, aluminum, plastic, and/or any other suitable material. Although intermediate member 106 may have any suitable size and/or shape, intermediate member 106 is depicted in the embodiments of FIG. 2 as having two generally parallel and planar opposite sides coupled to each other by a substantially planar bottom generally perpendicular to the sides. The height of the sides and the width of the bottom may be such that the corresponding sides and bottom of sleeve 104 provide a mechanical guide for intermediate member 106 as chassis drawer 102 is opened and closed. Intermediate member 106 may be mechanically coupled to sleeve 104 via bearings and/or other mechanical components such that intermediate member 106 may slide relative to sleeve 104 in a direction perpendicular to the drawer height and drawer width defined by sleeve 104. In some embodiments, intermediate member 106 may be limited in the distance it may be drawn from chassis 100 through any combination of suitable structural elements.

Carrier member 108 may be constructed from steel, aluminum, plastic, and/or any other suitable material. Although carrier member 108 may have any suitable size and/or shape, carrier member 108 is depicted in the embodiments represented by FIG. 2 as having a substantially planar top 114 and a substantially planar bottom 116 generally parallel to each other defining a width and depth of carrier member 108, the top 114 and bottom 116 mechanically coupled to each other by a mechanical member (e.g., not explicitly shown) that defines a height of carrier member 108, such that top 114 and bottom 116 are generally perpendicular to the sides of intermediate member 106. Carrier member 108 may also include a cover 110 mechanically affixed to top 114 and/or bottom 116. As shown in FIGS. 2-5, top 114 may include one or more openings (e.g., above bays 112) allowing for gaseous fluid to pass through. Similarly, bottom 116 may also include one or more openings (e.g., below bays 112) allowing for gaseous fluid to pass through.

In some embodiments, cover 110 may be substantially equal to the width of carrier member 108 and substantially equal to the height of carrier member 108. In these and other embodiments, cover 110 may include a grill, vent, and/or other opening allowing gaseous fluid to enter and/or exit through cover 110. As shown in FIG. 2, in these and other embodiments, cover 110 may have mechanically coupled thereto a handle 120. The structure and function of handle 120 is described in greater detail below.

As shown in FIG. 2, chassis drawer 102 may have an interface connector 118 configured to electrically couple to a backplane integral to carrier member 108 (not explicitly shown) when chassis drawer 102 is closed thus providing electrical coupling between information handling resources disposed in bays 112 and other information handling resources of chassis 100.

As shown in FIG. 2, carrier member 108 may have a plurality of bays 112 opening to each side of carrier member 108. Each of such bays 112 may be defined by an associated backplane and/or one or more structural elements of carrier member 108. Accordingly, a bay 112 may include a suitable combination of structural elements configured to mechanically mate with an information handling resource to allow components of the information handling resource to electrically couple to a backplane when such information handling resource is received into the bay 112. A bay 112 may also be configured to allow modular information handling resources to be easily inserted and removed from the bay 112 as desired by a user.

Although carrier member 108 may be constructed so as to support any suitable arrangement of bays 112, in the embodiments represented by FIG. 2, carrier member 108 is configured with 16 bays 112, eight on each side of carrier member 108 and arranged on each side such that two drives may be oriented one over the other in each of four openings.

In some embodiments, all bays 112 of carrier member 108 may be configured to receive identical or similar information handling resources having substantially similar form factors and/or functionality (e.g., 2.5-inch hard disk drives). In other embodiments, some bays 112 may be configured to receive an information handling resource different in form factor and/or functionality than that for which another bay 112 is configured.

Accordingly, drawer 102 may be drawn open allowing full-extension of carrier member 108 such that a person may access bays 112 to add and/or remove information handling resources from drawer 102. In addition, drawer 102 may be closed such that carrier member 108 is substantially telescoped within the depth of sleeve 104 such that cover 110 is generally parallel with a side of chassis 100.

Figure 3:
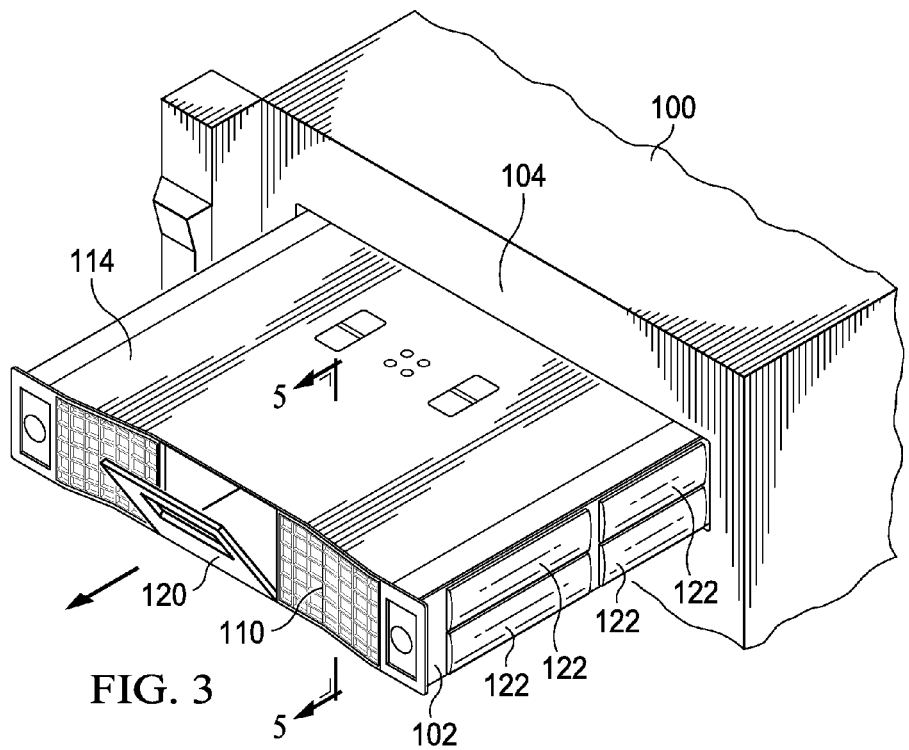
FIG. 3 illustrates a perspective view of an example chassis drawer for receiving modular information handling resources, the drawer being translated between a closed position and an open position, in accordance with embodiments of the present disclosure.

FIG. 3 illustrates a perspective view of example chassis drawer 102 having bays 112 populated with information handling resources 122 (e.g., hard disk drives) and chassis drawer 102 being translated between a closed position and an open position, in accordance with embodiments of the present disclosure. As shown in FIG. 3, handle 120 may be rotated by a user from a closed position (e.g., in which handle is flush with an outer surface of cover 110) into an open position that provides a mechanical advantage to a user to pull chassis drawer 102 from the closed position to the open position. In addition, as described in greater detail elsewhere in this disclosure, handle 120 may be mechanically coupled to a spring latch (e.g., via a shaft and a cam) and may, as handle 120 is rotated from its closed position to its open position, cause such spring latch to disengage from a corresponding mechanical structure of chassis 100 (e.g., an opening for receiving a flange of the spring latch), to allow chassis drawer 102 to be removed from chassis 100.

Figure 4:
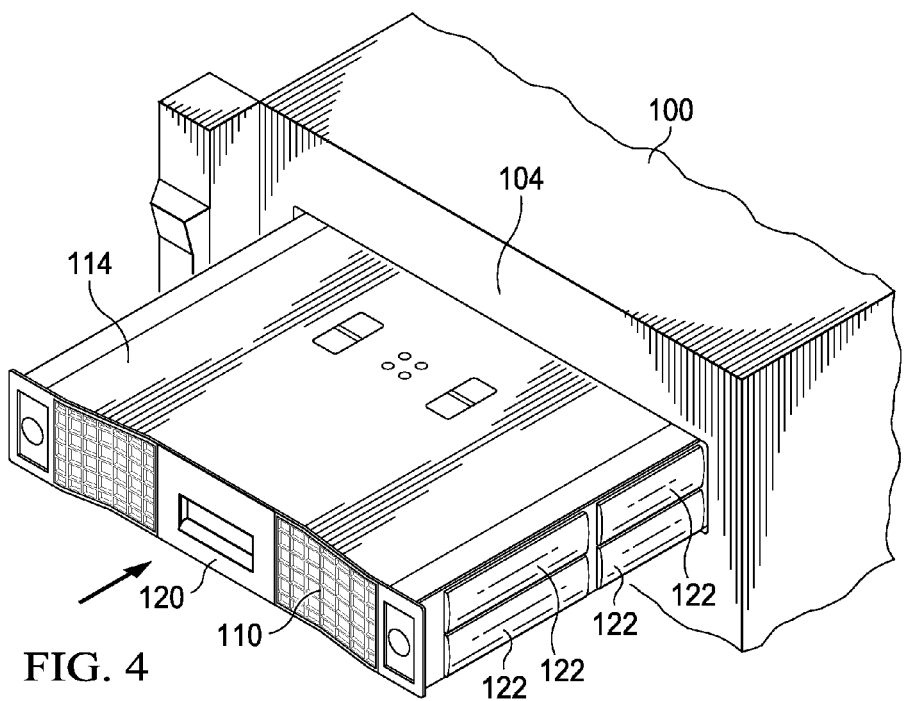
FIG. 4 illustrates a perspective view of an example chassis drawer for receiving modular information handling resources, the drawer being translated between an open position and a closed position, in accordance with embodiments of the present disclosure.

FIG. 4 illustrates a perspective view of example chassis drawer 102 being translated between the open position and the closed position, in accordance with embodiments of the present disclosure. As described in greater detail elsewhere in this disclosure, handle 120 may be mechanically coupled to cover 110 via a spring, such that when handle 120 is not acted upon by a user or other external force, such spring biases handle 120 in its closed position. In addition, as described in greater detail elsewhere in this disclosure, as chassis drawer 102 is translated between its open position to its closed position, a feature of the spring latch may engage with a corresponding mechanical structure of chassis 100 (e.g., an opening for receiving a flange of the spring latch), to allow chassis drawer 102 to be removed from chassis 100. In these embodiments, as described in greater detail elsewhere in this disclosure, chassis drawer 102 may provide mechanical feedback to a user to indicate that chassis drawer 102 has been fully inserted and that the spring latch has been engaged.

Figure 5:
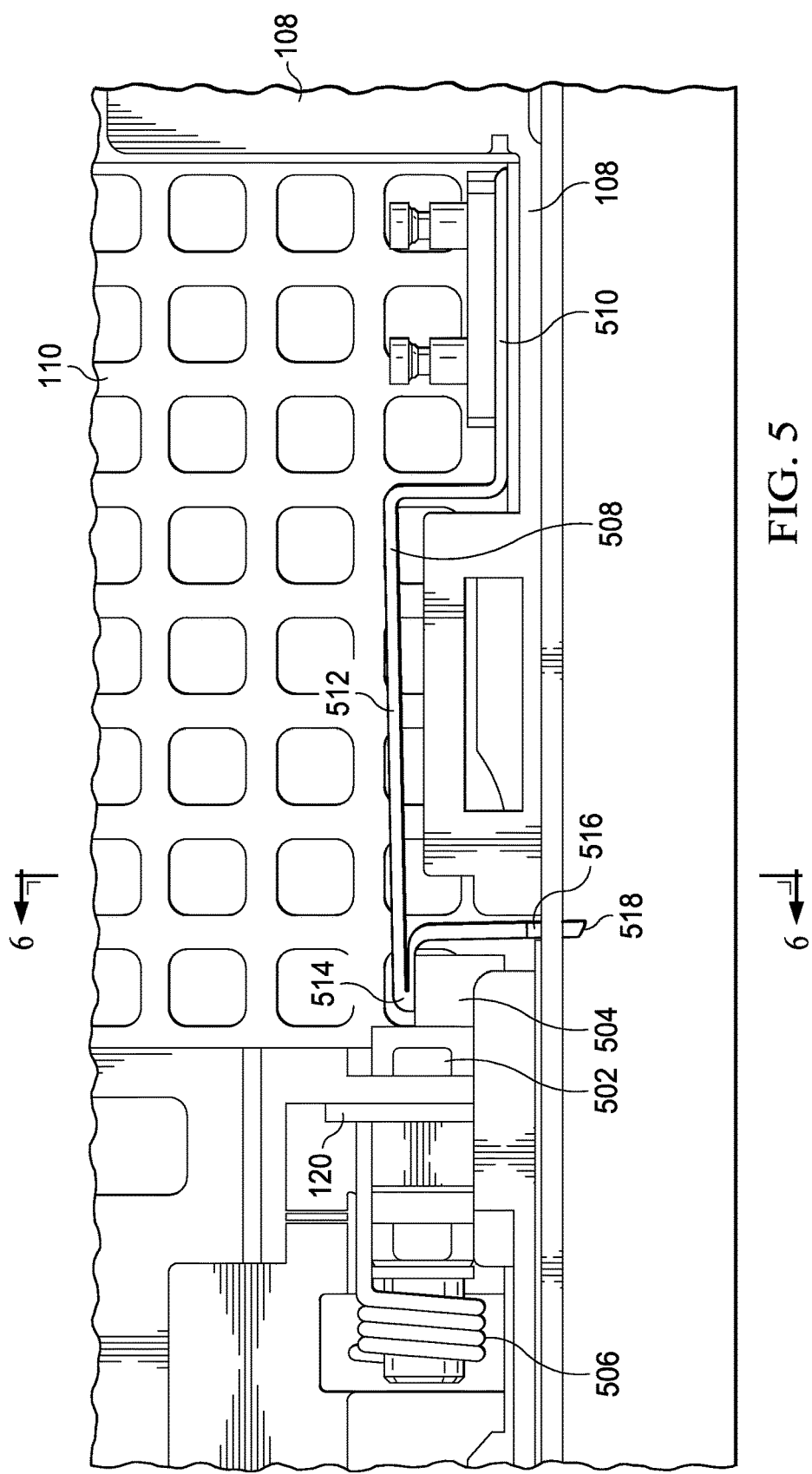
FIG. 5 illustrates an elevation view of selected components of the example chassis drawer depicted in FIGS. 1-4, in accordance with embodiments of the present disclosure.

FIG. 5 illustrates an elevation view of selected components of example chassis drawer 102 taken in the direction labeled "5" as depicted in FIG. 3, in accordance with embodiments of the present disclosure. As shown in FIG. 5, handle 120 may be mechanically coupled to a shaft 502 which may rotatably couple handle 120 to cover 110. Accordingly, cover 110 may include one or more suitable features (e.g., cylinders, holes, openings, etc.) constraining the motion of handle 120 relative to cover 110 such that the only motion of handle 120 relative to cover 110 is rotation of handle 120 about an axis defined by shaft 502 (e.g., such that the arced direction of rotation of handle 120 is in a plane substantially perpendicular to the drawer width and substantially parallel to the drawer height). As also shown in FIG. 5, shaft 502 may include a cam 504. Cam 504 may be adapted (e.g., sized and/or shaped) to mechanically engage with a spring latch 508 to facilitate disengagement of spring latch 508 from sleeve 104, as described in greater detail below. Cover 110, handle 120 and/or shaft 502 may also be mechanically coupled to a spring 506 having a spring force that biases handle 120 in its closed position in the absence of a force applied to handle 120 that opposes the spring force. In some embodiments, a portion of shaft 502 may pass through an opening defined by spring 506 (e.g., to reduce space required by the various components of chassis drawer 102).

Also as depicted in FIG. 5, a spring latch 508 may be mechanically coupled to cover 110. Spring latch 508 may include a fixed portion 510 and a moveable portion 512 comprising a cam engagement flange 514 and a sleeve engagement flange 516. Spring latch 508 may be mechanically coupled via its fixed portion 510 to cover 110 such that in operation of spring latch 508, fixed portion 510 may remain substantially fixed relative to cover 110. Spring latch 508 may have a spring force that biases movable portion 512 in a biased position in the absence of a force applied to spring latch 508 that opposes the spring force (e.g., an opposing force applied by cam 504 and/or the interaction of bezel 518 of sleeve engagement flange 516 with sleeve 104). Notably, spring latch 508 may be formed and oriented within chassis drawer 102 such that its most significant dimension (e.g., its length from fixed portion 510 to cam engagement flange 514) is in a direction perpendicular to the direction of motion of chassis drawer 102 when moving between its open and closed position and vice versa, which such most significant dimension is also in a direction parallel to the axis of rotation of handle 120. In addition, spring latch 508 may be formed and oriented within chassis drawer 102 such that its deflection is in a plane perpendicular to the direction of motion of chassis drawer 102 when moving between its open and closed position and vice versa. Such position may allow for the latching mechanism described herein to require a reduced amount of space compared to other alternatives.

Figure 6:
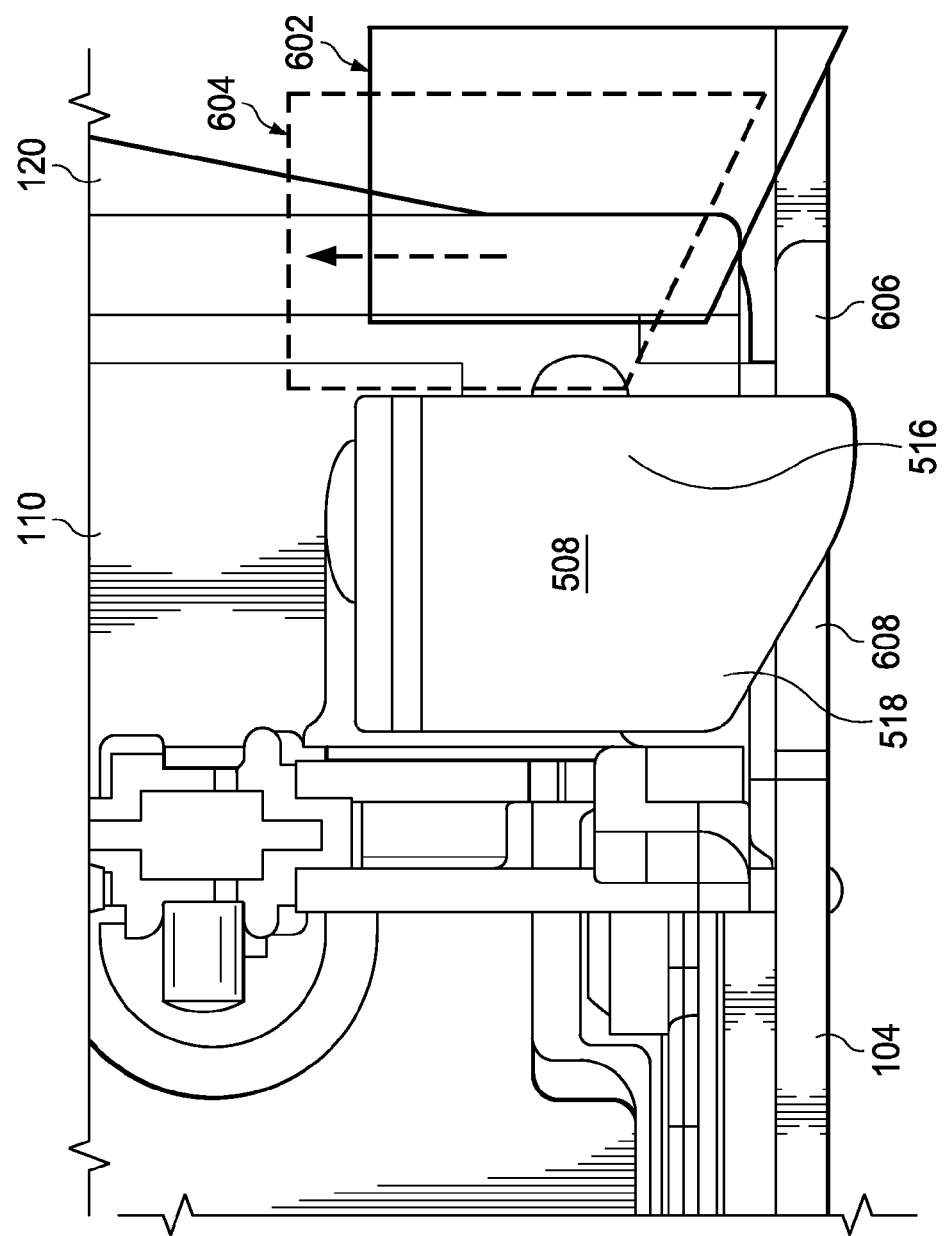
FIG. 6 illustrates a cross-sectional elevation view of selected components of the example chassis drawer depicted in FIGS. 1-5 depicting insertion of the chassis drawer into a chassis, in accordance with embodiments of the present disclosure.
Figure 7:
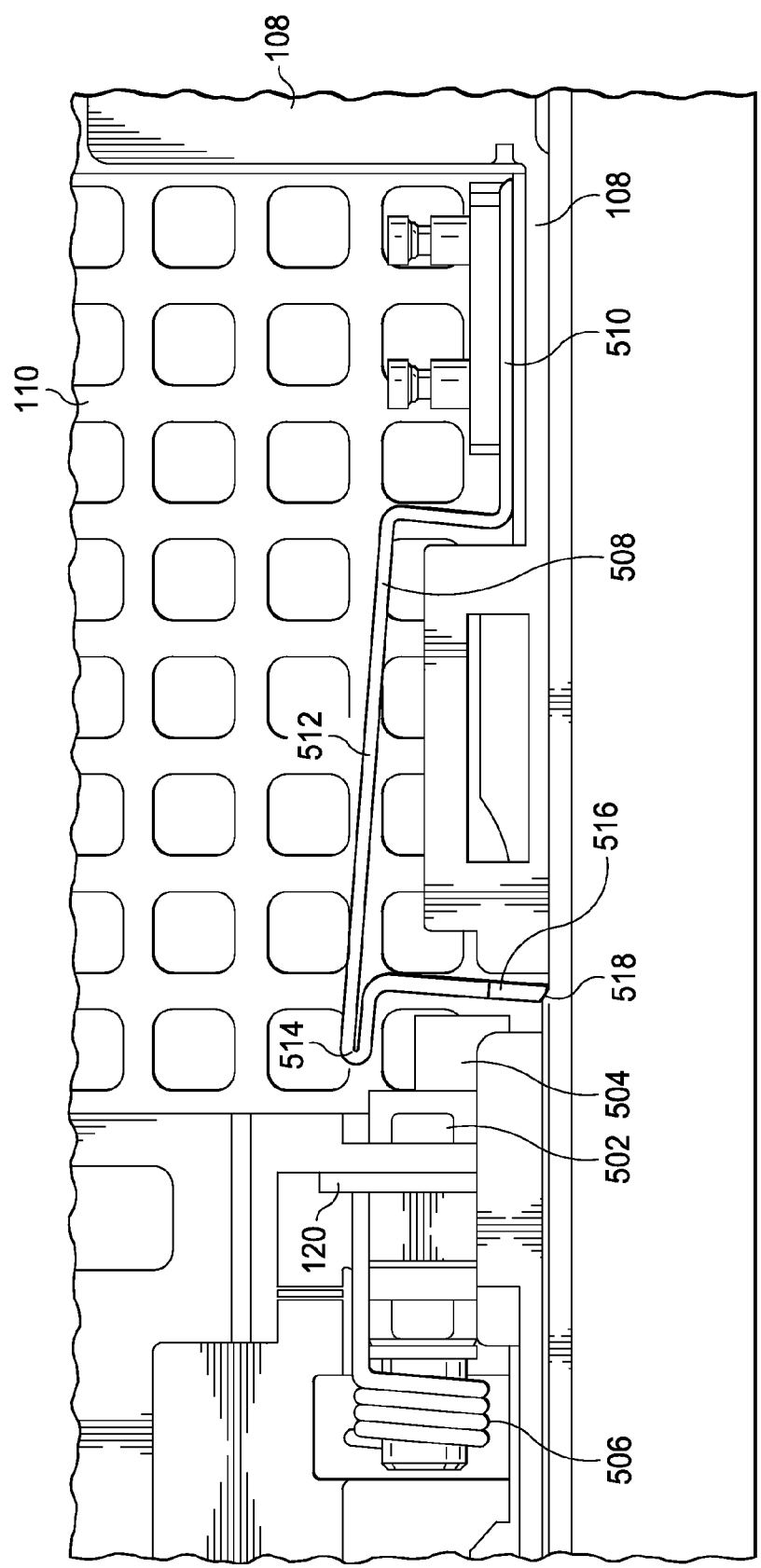
FIG. 7 illustrates an elevation view of selected components of the example chassis drawer depicted in FIGS. 1-6 during insertion of the chassis drawer into a chassis, in accordance with embodiments of the present disclosure.
Figure 8:
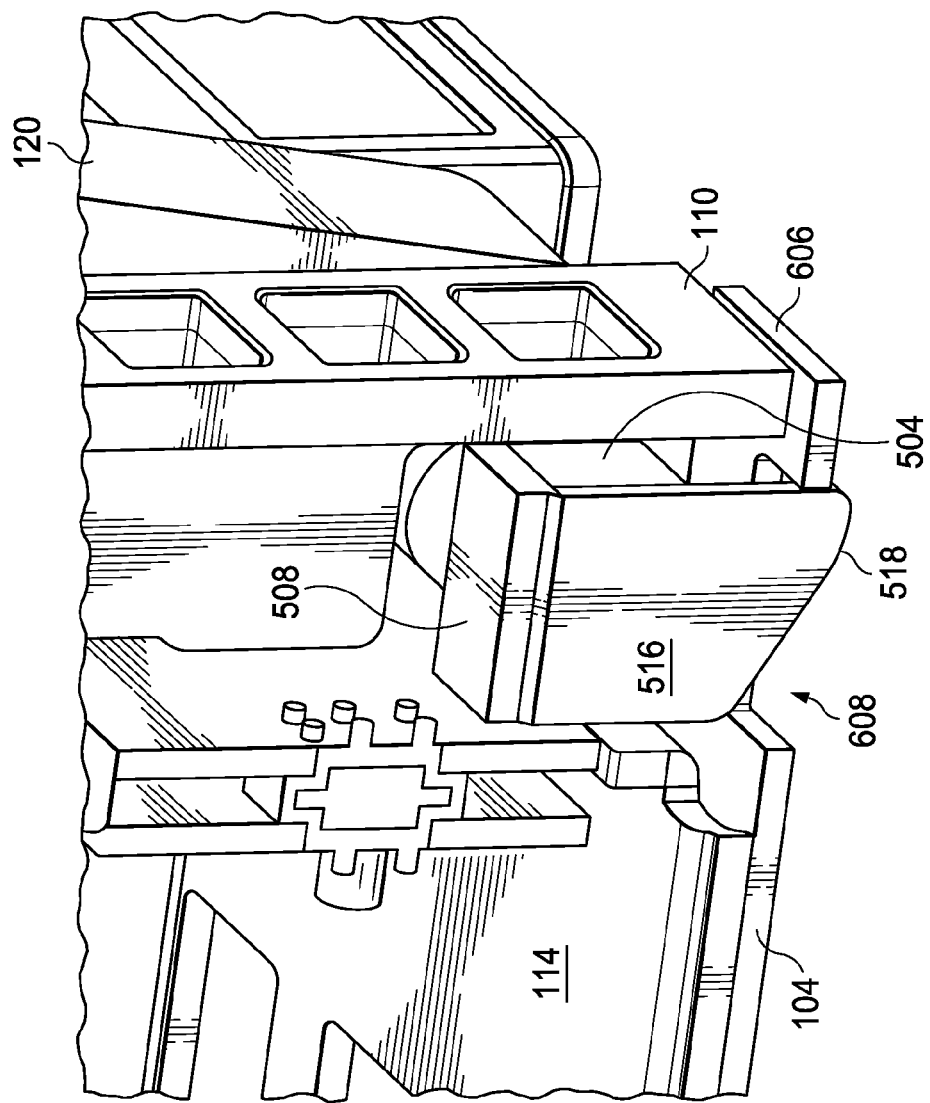
FIG. 8 depicts a perspective view of selected components of the chassis drawer depicted in FIGS. 1-7 with the chassis drawer fully inserted into a chassis, in accordance with embodiments of the present disclosure.

FIGS. 6-8 depict the engagement of spring latch 508 with sleeve 104 during insertion of chassis drawer 102 into chassis 100, in accordance with embodiments of the present disclosure. FIG. 6 illustrates a cross-sectional elevation view along the direction labeled "6" in FIG. 5 of selected components of chassis drawer 102 depicting insertion of chassis drawer 102 into chassis 100, in accordance with embodiments of the present disclosure. FIG. 7 illustrates an elevation view similar to that of FIG. 5 of selected components of chassis drawer 102 during insertion of chassis drawer 102 into chassis 100, in accordance with embodiments of the present disclosure. FIG. 8 depicts a perspective view of selected components of chassis drawer 102 with spring latch 508 engaged with latch engagement feature 608 of sleeve 104.

As shown in FIG. 6, as chassis drawer 102 is translated between its open position and closed position, chassis drawer 102 may reach a position such that bezel 518 of sleeve engagement flange 516 may interact with a feature 606 (e.g., an outer edge of sleeve 104 proximate to the opening for chassis drawer 102) to cause movable portion 512 of spring latch 508 to move from its biased position such that sleeve engagement flange 516 moves from a first position 602 (biased) to a second position 604 relative to cover 110 allowing chassis drawer 102 to fully insert into chassis 100. FIG. 7 depicts the deflection of movable portion 512 from the biased position in the view depicted in FIG. 5. After a trailing edge of sleeve engagement flange 516 has cleared feature 606, spring latch 508 may return to its biased position, wherein, as shown in FIG. 8, sleeve engagement flange 516 may engage with a corresponding mechanical feature 608 (e.g., an opening, flange, etc.) of sleeve 104 to prevent motion of chassis drawer 102 relative to chassis 100 (except in response to user engagement with handle 120, as described below).

Figure 9:
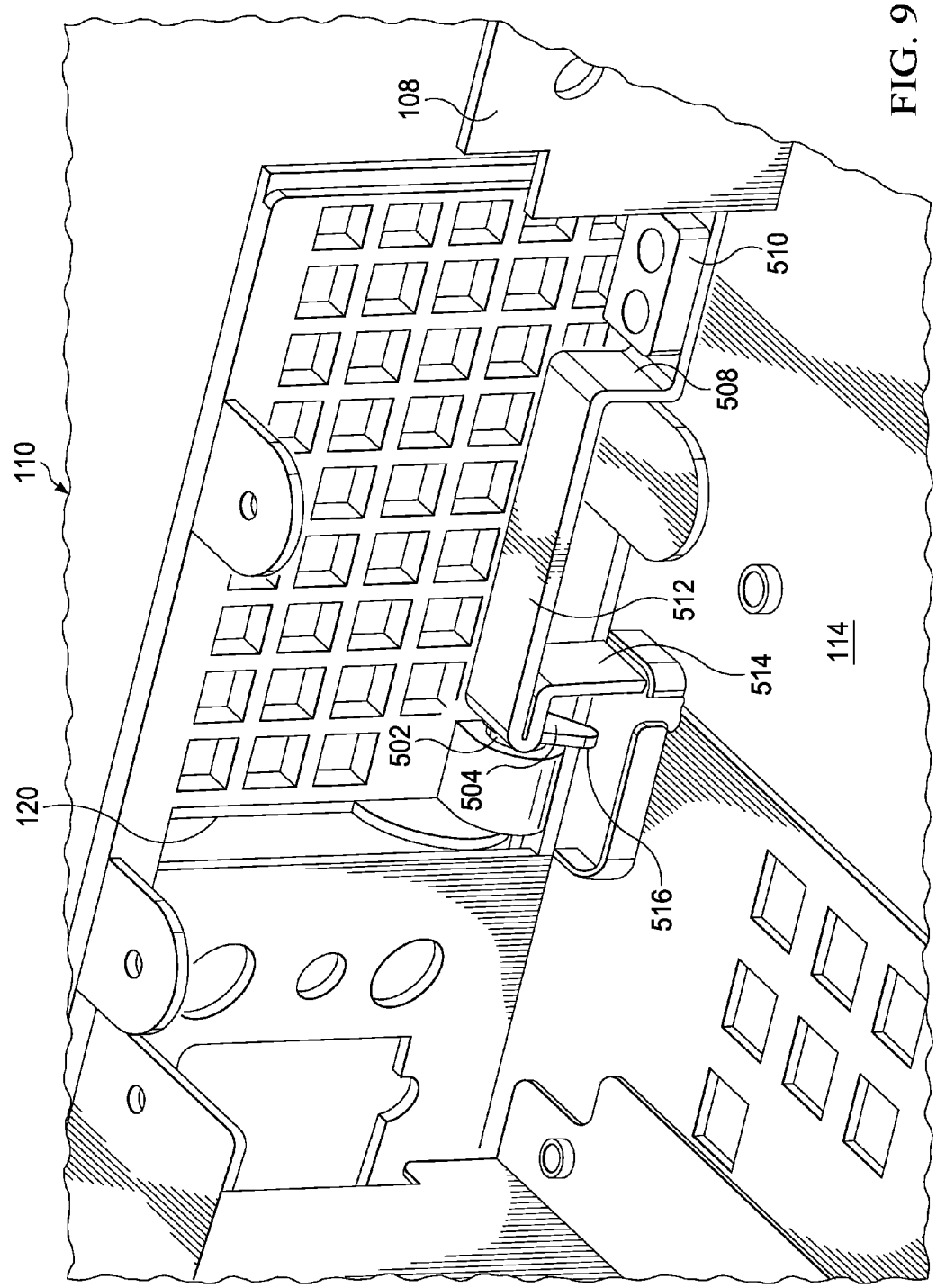
FIG. 9 depicts a perspective view of the disengagement of a spring latch from a sleeve during removal of the chassis drawer depicted in FIGS. 1-8 from a chassis with a handle of the chassis drawer in a closed position, in accordance with embodiments of the present disclosure.
Figure 10:
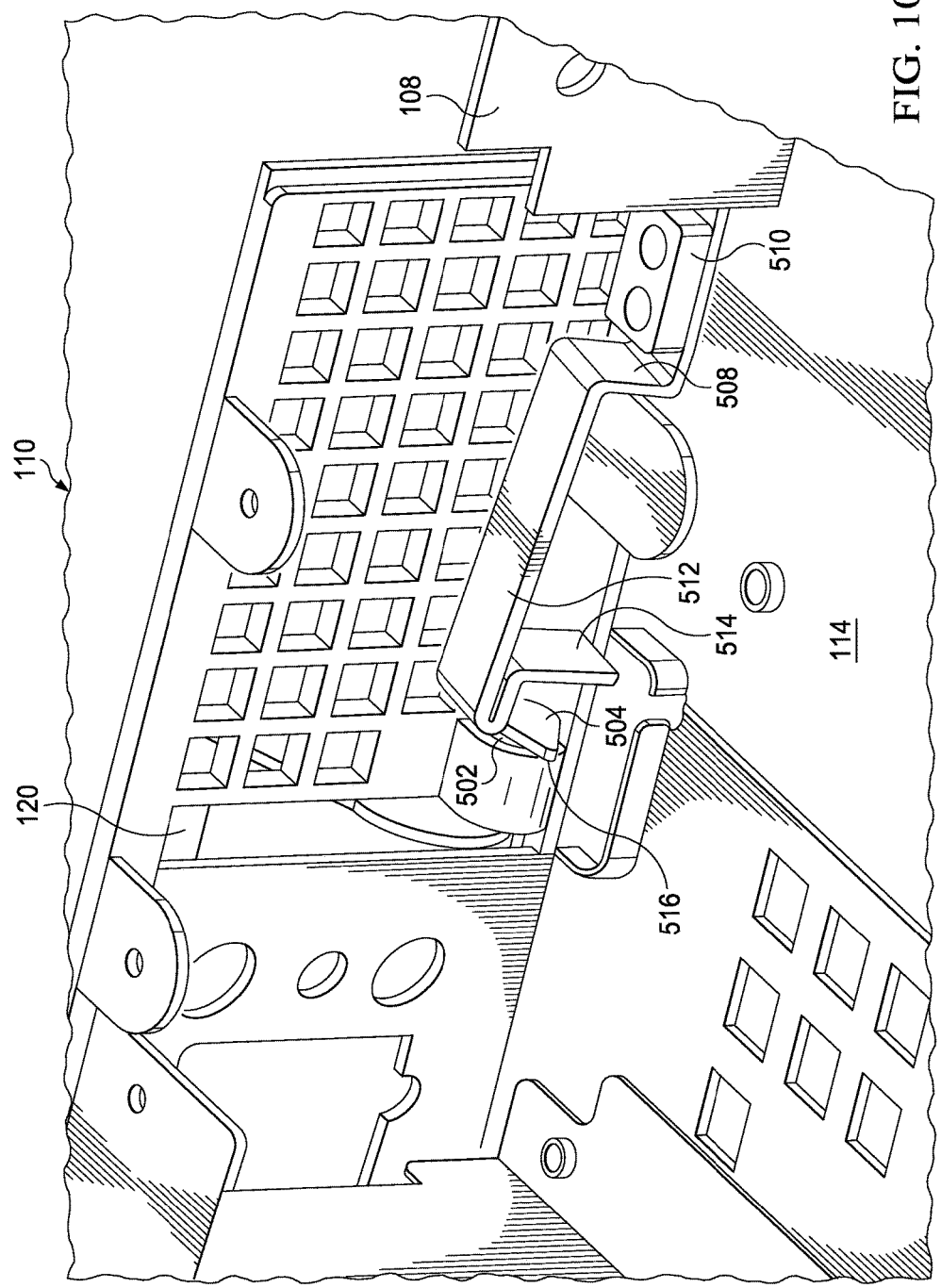
FIG. 10 depicts a perspective view of the disengagement of a spring latch from a sleeve during removal of the chassis drawer depicted in FIGS. 1-9 from a chassis with a handle of the chassis drawer in an open position, in accordance with embodiments of the present disclosure.

FIGS. 9 and 10 each depict perspective views of the disengagement of spring latch 508 from sleeve 104 during removal of chassis drawer 102 from chassis 100, in accordance with embodiments of the present disclosure. FIG. 9 depicts handle 120 in its closed position, while FIG. 10 depicts handle 120 in its open position. With handle 120 in its closed position, cam 504 may be oriented such that it allows spring latch 508 to maintain its biased position. However, as handle 120 is rotated about its axis (e.g., under a force applied by a user), shaft 502 and cam 504 may similarly rotate such that cam engages with cam engagement flange 514 of spring latch 508, causing movable portion 512 of spring latch 508 to deflect from its biased position, causing sleeve engagement flange 516 to disengage with feature 606 of sleeve 104 such that a user may remove chassis drawer 102 from chassis 100.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A drawer for receiving components, comprising:
a carrier member comprising a plurality of bays, each bay having one or more structural components for receiving a modular information handling resource;
a cover coupled to the carrier member; and
a mechanical assembly coupled to the cover, the mechanical assembly comprising:
a handle rotationally coupled to the cover and configured to rotate between a closed position and an open position relative to the cover;
a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis; and
a shaft including a cam mechanically coupling the handle to the cover and responsive to rotational motion of the handle about an axis defined by the shaft such that:
in the closed position of the handle, the spring latch is in its biased position and is configured to prevent translation of the drawer;
in the open position of the handle, the spring latch is in a position displaced from its biased position and is configured not to prevent translation of the drawer; and
as the handle is rotated from the closed position to the open position, the cam is configured to cause the spring latch to deflect from its biased position in a direction perpendicular to the direction of translation;
wherein the cover is coupled to at least one of the handle and the shaft via a spring having a second spring force configured to bias the handle in its closed position.

2. The drawer of claim 1, wherein an arced direction of rotation of the handle is in a plane substantially perpendicular to a width of the drawer.

3. The drawer of claim 2, wherein the arced direction of rotation of the handle is substantially parallel to a height of the drawer.

4. The drawer of claim 1, wherein the spring latch comprises a cam engagement flange configured to engage with the cam.

5. The drawer of claim 1, wherein the spring latch comprises a sleeve engagement flange configured to engage with a corresponding feature of the corresponding chassis when the drawer is fully inserted into the corresponding chassis.

6. The drawer of claim 5, wherein deflection of the spring latch from its biased position is configured to cause disengagement of the sleeve engagement flange from the corresponding feature.

7. The drawer of claim 5, wherein the sleeve engagement flange comprises a bevel configured to cause deflection of the spring latch from its biased position during insertion of the drawer into its corresponding chassis such that the sleeve engagement flange is configured to engage with the corresponding feature upon full insertion of the drawer into its corresponding chassis.

8. An information handling system comprising:
a chassis; and
a drawer for receiving components, comprising:
a carrier member comprising a plurality of bays, each bay having one or more structural components for receiving a modular information handling resource;
a cover coupled to the carrier member; and
a mechanical assembly coupled to the cover, the mechanical assembly comprising:
a handle rotationally coupled to the cover and configured to rotate between a closed position and an open position relative to the cover;
a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from the chassis; and
a shaft including a cam mechanically coupling to the handle to the cover and responsive to rotational motion of the handle about an axis defined by the shaft such that:
in the closed position of the handle, the spring latch is in its biased position and engages with a portion of the chassis such that the drawer is not translatable;
in the open position of the handle, the spring latch is in a position displaced from its biased position and does not engage with the portion of the chassis, such that the drawer is translatable; and
as the handle is rotated from the closed position to the open position, the cam is configured to cause the spring latch to deflect from its biased position in a direction perpendicular to the direction of translation;
wherein the cover is coupled to at least one of the handle and the shaft via a spring having a second spring force configured to bias the handle in its closed position.

9. The information handling system of claim 8, wherein a direction of rotation of the handle is in a plane substantially perpendicular to a width of the drawer.

10. The information handling system of claim 9, wherein the direction of rotation of the handle is substantially parallel to a height of the drawer.

11. The information handling system of claim 8, wherein the spring latch comprises a cam engagement flange configured to engage with the cam.

12. The information handling system of claim 8, wherein the spring latch comprises a sleeve engagement flange configured to engage with a corresponding feature of the chassis when the drawer is fully inserted into the chassis.

13. The information handling system of claim 12, wherein deflection of the spring latch from its biased position is configured to cause disengagement of the sleeve engagement flange from the corresponding feature.

14. The information handling system of claim 12, wherein the sleeve engagement flange comprises a bevel configured to cause deflection of the spring latch from its biased position during insertion of the drawer into its chassis such that the sleeve engagement flange is configured to engage with the corresponding feature upon full insertion of the drawer into its chassis.

15. A method comprising:
mechanically coupling a cover to a drawer that includes a carrier member comprising a plurality of bays, each bay having one or more structural components for receiving a modular information handling resource; and
mechanically coupling a mechanical assembly to the cover, the mechanical assembly comprising:
 a handle rotationally coupled to the cover and configured to rotate between a closed position and an open position relative to the cover;
 a spring latch mechanically coupled to the cover and having a spring force for maintaining the spring latch in a biased position in the absence of mechanical force opposing the spring force, the spring latch having its most significant dimension in a direction perpendicular to a direction of translation of the drawer when the drawer is inserted and removed from a corresponding chassis; and
 a shaft including a cam mechanically coupling the handle to the cover and responsive to rotational motion of the handle about an axis defined by the shaft such that:
  in the closed position of the handle, the spring latch is in its biased position and engages with a portion of the chassis to prevent translation of the drawer;
  in the open position of the handle, the spring latch is in a position displaced from its biased position and does not engage with the portion of the chassis to prevent translation of the drawer; and
  as the handle is rotated from the closed position to the open position, the cam causes the spring latch to deflect from its biased position in a direction perpendicular to the direction of translation;
 wherein the cover is coupled to at least one of the handle and the shaft via a spring having a second spring force configured to bias the handle in its closed position.

16. The method of claim 15, wherein a direction of rotation of the handle is in a plane substantially perpendicular to a width of the drawer.

17. The method of claim 15, wherein a direction of rotation of the handle is in a plane substantially parallel to a height of the drawer.

18. The method of claim 15, wherein the spring latch comprises a cam engagement flange configured to engage with the cam.

19. The method of claim 15, wherein the spring latch comprises a sleeve engagement flange configured to engage with a corresponding feature of the corresponding chassis when the drawer is fully inserted into the corresponding chassis.

20. The method of claim 19, wherein deflection of the spring latch from its biased position causes disengagement of the sleeve engagement flange from the corresponding feature.

21. The method of claim 19, wherein the sleeve engagement flange comprises a bevel configured to cause deflection of the spring latch from its biased position during insertion of the drawer into its corresponding chassis such that the sleeve engagement flange engages with the corresponding feature upon full insertion of the drawer into its corresponding chassis.

* * * * *